United States Patent
Hayashi et al.

(10) Patent No.: US 8,429,434 B2
(45) Date of Patent: Apr. 23, 2013

(54) CONTROL METHOD WITH MANAGEMENT SERVER APPARATUS FOR STORAGE DEVICE AND AIR CONDITIONER AND STORAGE SYSTEM

(75) Inventors: Shinichi Hayashi, Kawasaki (JP);
Yuichi Taguchi, Sagamihara (JP);
Katsumi Ouchi, Kawasaki (JP); Yoko Shiga, Yokohama (JP); Takeshi Kato, Akishima (JP); Jun Okitsu, Kodaira (JP); Tadakatsu Nakajima, Kasumigaura (JP)

(73) Assignee: Hitachi, Ltd., Tokyo (JP)

( * ) Notice: Subject to any disclaimer, the term of this patent is extended or adjusted under 35 U.S.C. 154(b) by 769 days.

(21) Appl. No.: 12/361,816

(22) Filed: Jan. 29, 2009

(65) Prior Publication Data
US 2010/0106988 A1 Apr. 29, 2010

(30) Foreign Application Priority Data
Oct. 29, 2008 (JP) ................................. 2008-277601

(51) Int. Cl.
*G06F 1/32* (2006.01)
*G06F 1/00* (2006.01)
*G01K 7/00* (2006.01)

(52) U.S. Cl.
USPC ............................ 713/320; 713/300; 702/130

(58) Field of Classification Search .................... 713/320
See application file for complete search history.

(56) References Cited

U.S. PATENT DOCUMENTS

| 7,197,433 | B2 * | 3/2007 | Patel et al. ..................... 702/188 |
| 7,373,268 | B1 * | 5/2008 | Viredaz et al. ................. 702/130 |
| 7,447,920 | B2 * | 11/2008 | Sharma et al. ................. 713/300 |
| 7,472,558 | B1 * | 1/2009 | Narita .............................. 62/175 |
| 7,676,280 | B1 * | 3/2010 | Bash et al. ........................ 700/17 |
| 2003/0193777 | A1 * | 10/2003 | Friedrich et al. .............. 361/687 |
| 2006/0259621 | A1 | 11/2006 | Ranganathan et al. |
| 2006/0259793 | A1 | 11/2006 | Moore et al. |

FOREIGN PATENT DOCUMENTS
JP 2004-126968 4/2004

* cited by examiner

*Primary Examiner* — Suresh Suryawanshi
(74) *Attorney, Agent, or Firm* — Antonelli, Terry, Stout & Kraus, LLP.

(57) ABSTRACT

Arrangements reducing power consumption of an air conditioner and a storage device. A control method with a management server apparatus for a plurality of storage devices and an air conditioner includes calculating plural combinations of allocating the work amount to the plurality of storage devices, calculating the heating value of each storage device included in the plurality of storage devices for each of the plural combinations, calculating the quantity of heat conducted to the air conditioner, based on the heating value and positional information of the plurality of storage devices and the air conditioner, calculating the power consumption to cool the quantity of heat conducted to the air conditioner, selecting a combination included in the plural combinations based on the power consumption of the air conditioner, and issuing a move of the data stored in a first storage device to a second storage device, based on the selected combination.

15 Claims, 25 Drawing Sheets

FIG. 7

| DEVICE NAME | POSITION | | | SIZE | | |
|---|---|---|---|---|---|---|
| | X COORDI-NATE | Y COORDI-NATE | Z COORDI-NATE | WIDTH | DEPTH | HEIGHT |
| AIR CONDITIONER (1) | 1 | 0 | 0 | 2 | 1 | 2 |
| AIR CONDITIONER (2) | 5 | 0 | 0 | 2 | 1 | 2 |
| TEMPERATURE SENSOR (1) | 1 | 0 | 2 | . | . | . |
| TEMPERATURE SENSOR (2) | 5 | 0 | 2 | . | . | . |
| RACK a | 1 | 2 | 0 | 1 | 1 | 2 |
| RACK b | 2 | 2 | 0 | 1 | 1 | 2 |
| RACK c | 3 | 2 | 0 | 1 | 1 | 2 |
| .. | .. | .. | .. | .. | .. | .. |

FIG. 8

| DEVICE NAME | RACK NAME | OWNER | HEATING VALUE FUNCTION |
|---|---|---|---|
| STORAGE DEVICE 1 | RACK a | A | $a_1x + b_1$ |
| STORAGE DEVICE 2 | RACK a | A | $a_2x + b_2$ |
| STORAGE DEVICE 3 | RACK b | A | $a_3x + b_3$ |
| STORAGE DEVICE 4 | RACK b | A | $a_4x + b_4$ |
| STORAGE DEVICE 5 | RACK c | A | $a_5x + b_5$ |
| STORAGE DEVICE 6 | RACK c | A | $a_6x + b_6$ |
| BUSINESS SERVER APPARATUS 1 | RACK a | A | $c_1x + d_1$ |
| BUSINESS SERVER APPARATUS 2 | RACK a | B | $c_2x + d_2$ |
| .. | .. | .. | .. |

FIG. 9

| SECONDARY STORAGE NAME | STORAGE DEVICE NAME | RG NAME | POWER STATE |
|---|---|---|---|
| STORAGE UNIT 1 | STORAGE DEVICE 1 | RG1 | ON |
| STORAGE UNIT 2 | STORAGE DEVICE 1 | RG1 | ON |
| STORAGE UNIT 3 | STORAGE DEVICE 2 | RG1 | ON |
| STORAGE UNIT 4 | STORAGE DEVICE 2 | RG1 | ON |
| STORAGE UNIT 5 | STORAGE DEVICE 3 | RG2 | ON |
| STORAGE UNIT 6 | STORAGE DEVICE 3 | RG2 | ON |
| STORAGE UNIT 7 | STORAGE DEVICE 4 | RG2 | ON |
| STORAGE UNIT 8 | STORAGE DEVICE 4 | RG2 | ON |
| STORAGE UNIT 9 | STORAGE DEVICE 5 | RG3 | ON |
| STORAGE UNIT 10 | STORAGE DEVICE 5 | RG3 | ON |
| STORAGE UNIT 11 | STORAGE DEVICE 6 | RG3 | ON |
| STORAGE UNIT 12 | STORAGE DEVICE 6 | RG3 | ON |
| .. | .. | .. | .. |

FIG. 10

| VOLUME NAME /1001 | RG NAME /1002 | CAPAC-ITY /1003 | MOVEMENT POSSIBILITY /1004 | CONNECTION SOURCE /1005 | BACKUP TARGET /1006 /1007 |
|---|---|---|---|---|---|
| VOLUME 1 | RG1 | 100 | MOVABLE | SERVER APPARATUS 1 | VOLUME 11 |
| VOLUME 2 | RG1 | 100 | MOVABLE | SERVER APPARATUS 1 | VOLUME 12 |
| VOLUME 3 | RG2 | 200 | MOVABLE | SERVER APPARATUS 2 | VOLUME 13 |
| VOLUME 4 | RG2 | 200 | MOVABLE | SERVER APPARATUS 2 | VOLUME 14 |
| VOLUME 5 | RG3 | 150 | MOVABLE | SERVER APPARATUS 3 | VOLUME 15 |
| VOLUME 6 | RG3 | 150 | IMMOVABLE | SERVER APPARATUS 3 | VOLUME 16 |
| .. | .. | .. | .. | .. | .. |

FIG. 11

| RG NAME | RAID LEVEL | NUMBER OF DISKS | DISK TYPE | POWER CONSUMPTION | NUMBER OF VOLUMES | FREE CAPACITY | MARGINAL WORK AMOUNT | UPPER LIMIT WORK AMOUNT |
|---|---|---|---|---|---|---|---|---|
| RG1 | RAID 5 | 3 | FC HDD | 150 | 2 | 100 | 2000 | 1400 |
| RG2 | RAID 5 | 3 | FC HDD | 150 | 2 | 100 | 2000 | 1400 |
| RG3 | RAID 5 | 3 | FC HDD | 150 | 2 | 100 | 2000 | 1400 |
| RG4 | RAID 6 | 6 | SATA HDD | 100 | 10 | 300 | 1000 | 700 |
| RG5 | RAID 6 | 6 | SATA HDD | 100 | 15 | 400 | 1000 | 700 |
| .. | | | | | | | | .. |

FIG. 12

| DEVICE NAME | WORK AMOUNT HISTORY |
|---|---|
| SERVER APPARATUS 1 | 20 |
| SERVER APPARATUS 2 | 50 |
| SERVER APPARATUS 3 | 80 |
| ⋮ | ⋮ |

FIG. 13

| RG NAME | WORK AMOUNT HISTORY |
|---|---|
| RG1 | 1000 |
| RG2 | 400 |
| RG3 | 1600 |
| : | : |

FIG. 15

| | 1501 | 1502 | 1503 |
|---|---|---|---|
| | DEVICE NAME | WORK AMOUNT HISTORY | |
| | STORAGE DEVICE 1 | 500 | |
| | STORAGE DEVICE 2 | 500 | |
| | STORAGE DEVICE 3 | 200 | |
| | STORAGE DEVICE 4 | 200 | |
| | STORAGE DEVICE 5 | 800 | |
| | STORAGE DEVICE 6 | 800 | |
| | : | : | |

FIG. 16

| STORAGE DEVICE NAME | STORAGE DEVICE NAME |
|---|---|
| STORAGE DEVICE 1 | STORAGE DEVICE 2 |
| STORAGE DEVICE 1 | STORAGE DEVICE 3 |
| STORAGE DEVICE 2 | STORAGE DEVICE 3 |
| : | : |

FIG. 17

| SERVER APPARATUS NAME ~1701 | STORAGE DEVICE NAME ~1702 ~1703 |
|---|---|
| SERVER APPARATUS 1 | STORAGE DEVICE 1 |
| SERVER APPARATUS 1 | STORAGE DEVICE 2 |
| SERVER APPARATUS 2 | STORAGE DEVICE 2 |
| SERVER APPARATUS 2 | STORAGE DEVICE 3 |
| : | : |

FIG. 18

| STORAGE DEVICE NAME ~1801 | WORK AMOUNT INCREASE/DECREASE ~1802 | ~1803 |
|---|---|
| STORAGE DEVICE 1 | -200 |
| STORAGE DEVICE 2 | -200 |
| STORAGE DEVICE 3 | +300 |
| STORAGE DEVICE 4 | +300 |
| STORAGE DEVICE 5 | -100 |
| STORAGE DEVICE 6 | -100 |
| : | : |

FIG. 19

| VOLUME NAME | MOVEMENT SOURCE RG | MOVEMENT DESTINATION RG |
|---|---|---|
| VOLUME 1 | RG1 | RG2 |
| VOLUME 5 | RG3 | RG2 |
| ⋮ | ⋮ | ⋮ |

FIG. 24

| DEVICE NAME 2401 | AIR CONDITIONER NAME 2402 | HEATING VALUE 2403 | DIS-TANCE 2404 | DISTRIBUTION FACTOR 2405 |
|---|---|---|---|---|
| STORAGE DEVICE 1 | AIR CONDITIONER 1 | 100 | 2 | 40% |
| STORAGE DEVICE 1 | AIR CONDITIONER 2 | | 5 | 16% |
| STORAGE DEVICE 1 | AIR CONDITIONER 3 | | 8 | 10% |
| STORAGE DEVICE 1 | AIR CONDITIONER 4 | | 6 | 13% |
| STORAGE DEVICE 1 | AIR CONDITIONER 5 | | 7 | 11% |
| STORAGE DEVICE 1 | AIR CONDITIONER 6 | | 9 | 9% |
| STORAGE DEVICE 2 | AIR CONDITIONER 1 | 90 | 2 | 38% |
| STORAGE DEVICE 2 | AIR CONDITIONER 2 | | 4 | 13% |
| .. | .. | .. | .. | .. |

| HEAT QUANTITY /2501 | AIR CONDITIONING OUTPUT /2502 | POWER CONSUMPTION /2503 |
| --- | --- | --- |
| 0 ~ 50 | 1 | 300 |
| 51 ~ 100 | 2 | 305 |
| 101 ~ 150 | 3 | 315 |
| 151 ~ 200 | 4 | 330 |
| 201 ~ 250 | 5 | 350 |
| 251 ~ 300 | 6 | 375 |

/2504

CONTROL METHOD WITH MANAGEMENT SERVER APPARATUS FOR STORAGE DEVICE AND AIR CONDITIONER AND STORAGE SYSTEM

CROSS REFERENCES TO RELATED APPLICATIONS

This application relates to and claims priority from Japanese Patent Application No. 2008-277601, filed on Oct. 29, 2008, the entire disclosure of which is incorporated herein by reference.

BACKGROUND OF THE INVENTION

1. Field of the Invention

The present invention relates to a control method with a management server apparatus for a storage device and an air conditioner, and more particularly to a control method for providing a control for the lower power consumption (power saving).

2. Description of the related Art

With the rapid development of the information communication technology in recent years, it is expected that the information processing apparatuses and the amount of data to be processed will increase explosively. Because of the greater heating value generated by a server of a typical information processing apparatus with higher performance and the high integration servers, there is a problem that the power consumption and the heating value in a data center are increased. Further, because the discharged amount of carbon dioxide increases, the global warming is another problem.

In JP-A-2007-179437 (Patent document 1) a technique was disclosed in which in a system for managing a plurality of computers, a superheated computer and a non-superheated computer are extracted, based on an operating situation and a temperature distribution of the plurality of computers, and software operating on the superheated computer is performed on the non-superheated computer, thereby reducing the power consumption. Further, in patent document 1, another technique was disclosed for judging whether or not software operating on the superheated computer is performed on the non-superheated computer by comparing the power consumption between the computer and the air conditioner when software operating on the extracted superheated computer is performed on the extracted non-superheated computer.

SUMMARY OF THE INVENTION

Since the high performance and high integration servers are put together in the data center bearing an information processing basis, the power consumption of a power supply installation, and an air conditioner is a significant problem, whereby a reduction in the total power consumption of an information processing apparatus and the installation is a great subject.

For the power saving of the data center, to grapple with the power saving problem of the information processing apparatus and the installation has started, and the power saving of a server apparatus, a storage device, a network apparatus, a power supply installation, and an air conditioner itself has progressed. Further, to promote the power saving, it is required that the information processing apparatus and the air conditioner cooperate to reduce the power consumption of the entire data center.

According to patent document 1, the software operating on the superheated computer is performed on the non-superheated computer, but the power consumption consumed by the entire data center can not be necessarily reduced.

For example, a plurality of servers are cooled by a plurality of air conditioners in the data center. Accordingly, even if the process is simply transferred from the superheated server apparatus to the non-superheated server apparatus and uniformly distributed without considering the positional relationship between the plurality of air conditioners installed and the plurality of server apparatuses installed, the cooling efficiency of the air conditioner can not be always improved. Also, the operation of software is concentrated on a specific computer in the server apparatus and the power of the computer unnecessary to operate the software is shut down, whereby the power consumption may be reduced.

Moreover, the information processing apparatus for use in the data center may be not only the server apparatus but also the storage device. However, patent document 1 did not disclose that the power consumption of both the storage device and the air conditioner could be reduced in the relationship between the storage device and the air conditioner.

In order to solve the above-mentioned problems, the present invention provides a control method with a management server apparatus for use in a storage system comprising a plurality of storage devices having a plurality of memory units connected to the management server apparatus to provide a logical volume and making up a plurality of RAID groups, and an air conditioner connected to the management server apparatus, the method characterized by including calculating plural combinations of allocating the work amount to the plurality of storage devices, calculating the heating value of each storage device included in the plurality of storage devices for each of the plural combinations, calculating the distribution factor of the heating value to the air conditioner, based on the heating value and positional information of the plurality of storage devices and the air conditioner for each of the plural combinations, calculating the quantity of heat conducted to the air conditioner from the heating value and the distribution factor, calculating the power consumption of the air conditioner to cool the quantity of heat conducted to the air conditioner for each of the plural combinations, selecting a combination included in the plural combinations based on the power consumption of the air conditioner, and issuing a move instruction of moving the data stored in a first storage device to increase the work amount to a second storage device to decrease the work amount to the plurality of storage devices, based on the selected combination.

With the invention, the power consumption of the air conditioner and the power consumption of the storage device can be reduced.

BRIEF DESCRIPTION OF THE DRAWINGS

FIG. 7 is a diagram showing positional information of devices according to this embodiment.

FIG. 8 is a diagram showing the configuration of the storage device according to this embodiment.

FIG. 9 is a diagram showing the configuration of memory units according to this embodiment.

FIG. 10 is a diagram showing the configuration of the logical volume according to this embodiment.

FIG. 11 is a diagram showing the configuration of the RG according to this embodiment.

FIG. 12 is a diagram showing the work amount history of the server apparatus according to this embodiment.

FIG. 13 is a diagram showing the work amount history of the RG according to this embodiment.

FIG. 15 is a diagram showing the work amount history of the storage device according to this embodiment.

FIG. 16 is a diagram showing the connectivity between the storage devices according to this embodiment.

FIG. 17 is a diagram showing the connectivity between the server apparatus and the storage device according to this embodiment.

FIG. 18 is a diagram showing the increase or decrease in the work amount of the storage device according to this embodiment.

FIG. 19 is a diagram showing the movement destination of the logical volume according to this embodiment.

FIG. 24 is a diagram showing the distance and the heat distribution factor from the storage device to the air conditioner according to this embodiment.

FIG. 25 is a diagram showing the output and the power consumption corresponding to the quantity of heat conducted to the air conditioner according to this embodiment.

DESCRIPTION OF THE PREFERRED EMBODIMENTS

One embodiment of the present invention will be described below with reference to the drawings.

Figure 1:
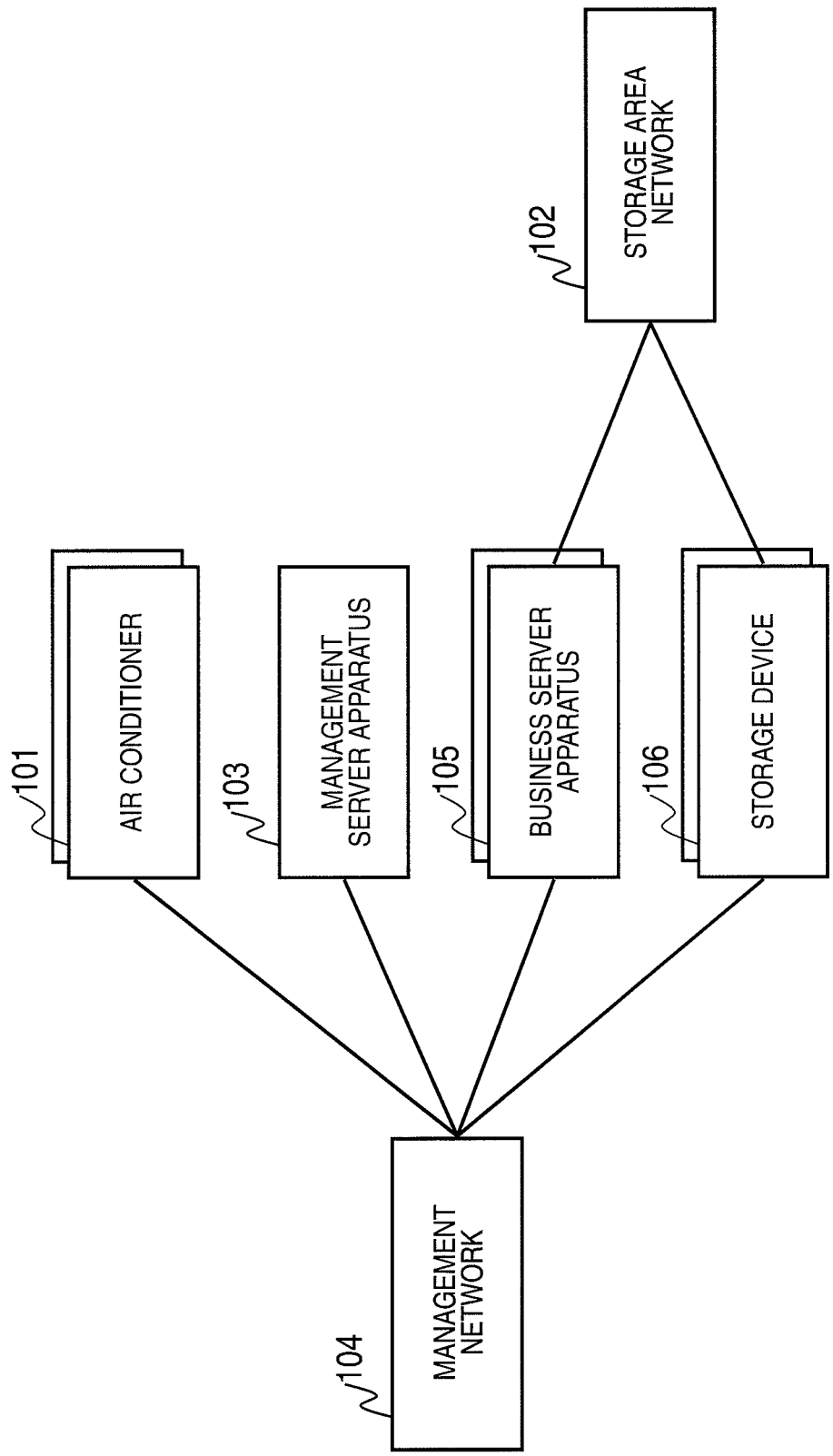
FIG. 1 is a diagram showing a system configuration according to this embodiment.

FIG. 1 is a diagram showing a system configuration according to this embodiment. This system comprises an air conditioner 101, a storage area network 102, a management server apparatus 103, a management network 104, a business server apparatus 105, and a storage device 106. The air conditioner 101, the management server apparatus 103, the business server apparatus 105, and the storage device 106 are coupled via the management network 104. The business server apparatus 105 and the storage device 106 are coupled via the storage area network 102. The management network 104 may be the Ethernet (registered trademark), for example. And the management network 104 is used by the management server apparatus in managing each unit. For example, the management server apparatus 103 can acquire various kinds of information from the storage device 106 via the management network 104. The storage area network 102 maybe a fiber channel, for example. And the storage area network 102 is used for the business server apparatus 105 to read information required for the business transaction from the storage device 106 and write it into the storage device 106.

Figure 2:
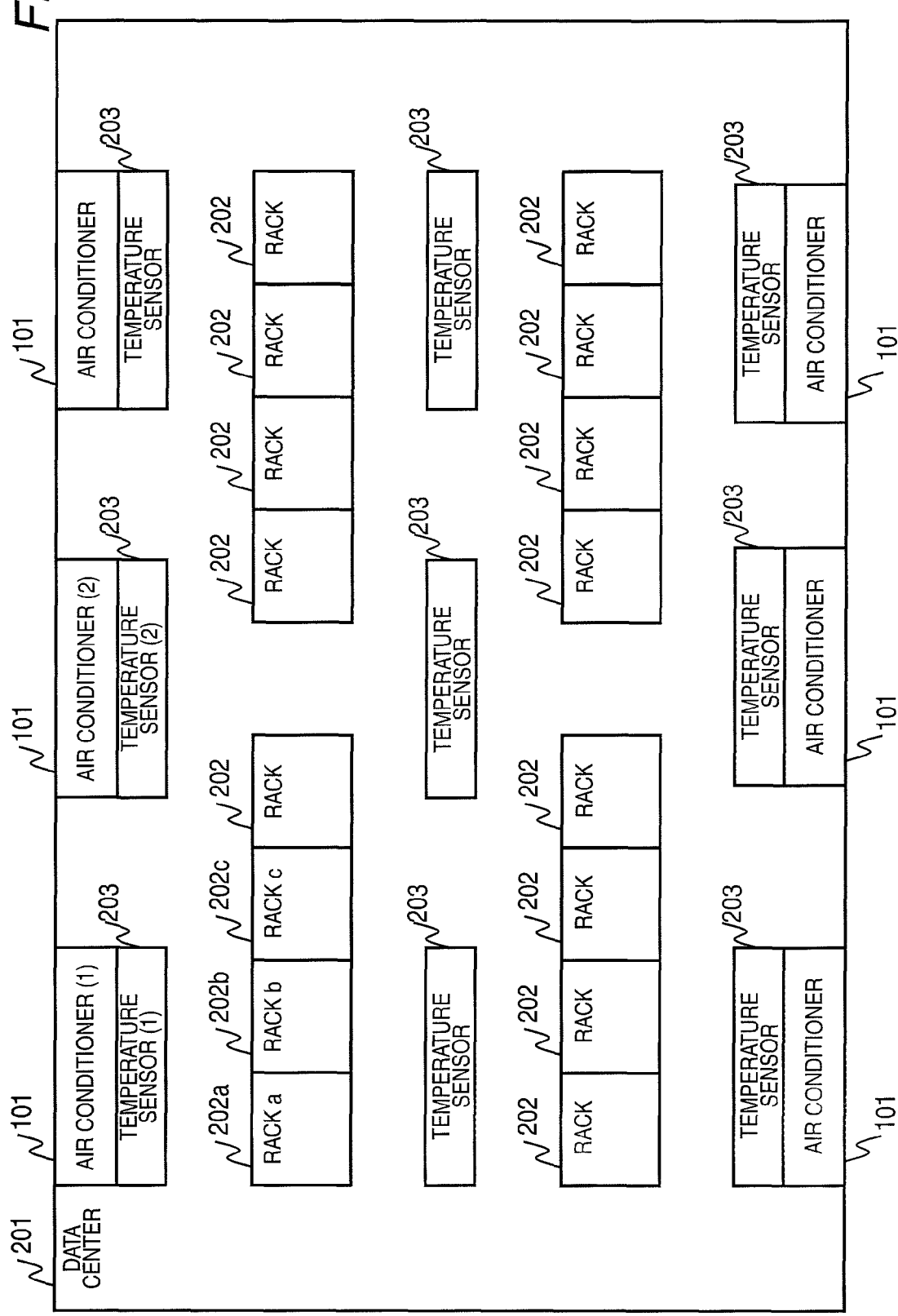
FIG. 2 is a diagram showing the arrangement of devices in the data center according to this embodiment.

FIG. 2 is one example of a system arrangement diagram for a data center 201 of this embodiment, as observed from the above. In the data center of this embodiment, the air conditioners 101, the temperature sensors 203 and the racks 202 are arranged in the data center 201, as shown in FIG. 2. The details of the rack 202 will be described below using FIG. 3. In the data center of this embodiment, the temperature sensor 203 is arranged between each air conditioner 101 and the rack 202. It is noted that the place where the temperature sensor 203 is arranged is not limited to this layout.

Figure 3:
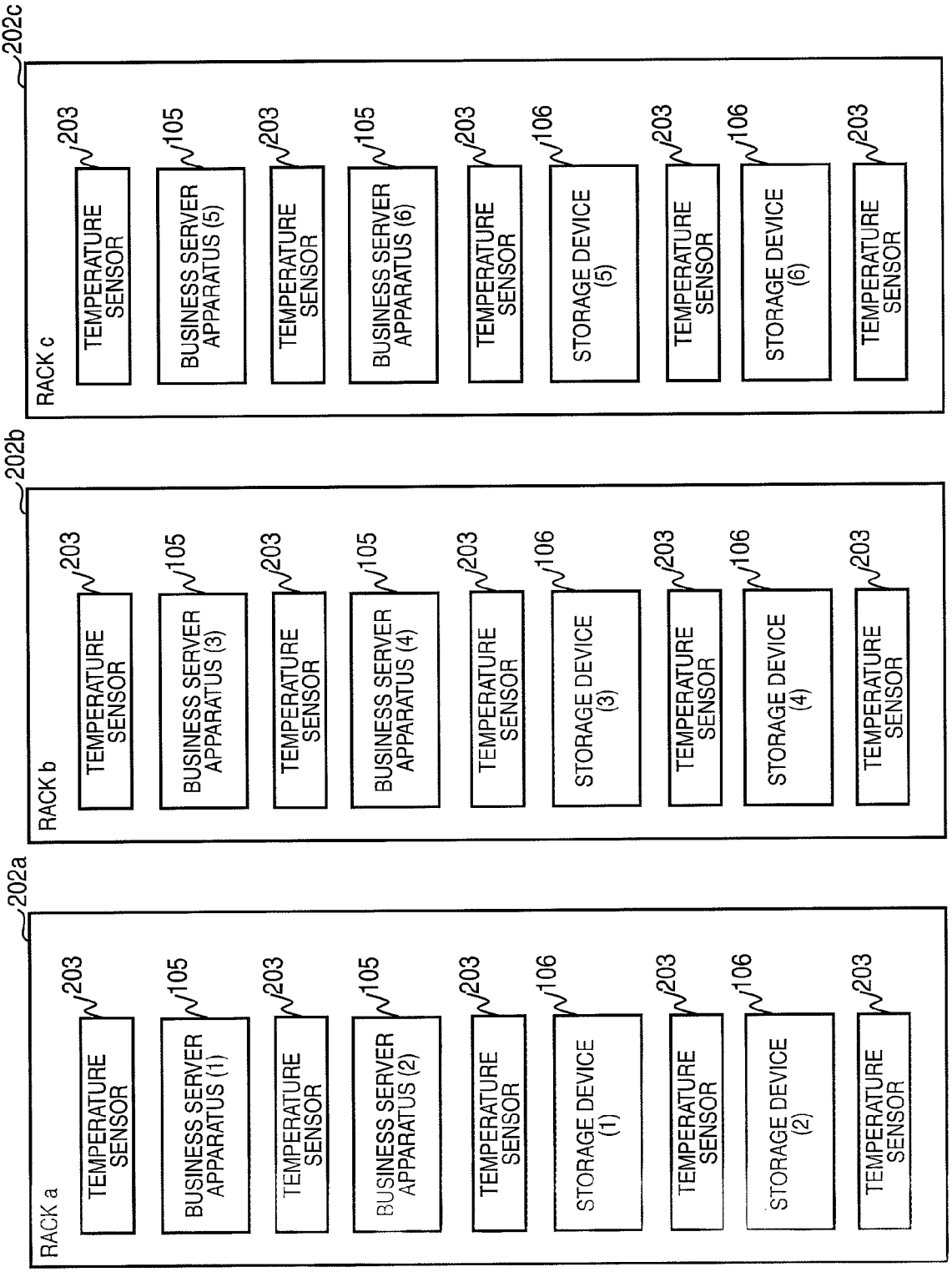
FIG. 3 is a diagram showing the arrangement of devices within the rack according to this embodiment.

FIG. 3 is one example of a system arrangement diagram for the racks 202 of this embodiment as observed from the side. In a rack 202a, a business server apparatus (1) 105, a business server apparatus (2) 105, a storage device (1) 106, and a storage device (2) 106 are arranged from the top, with the temperature sensor 203 arranged between each apparatus, as shown in FIG. 3. In a rack 202b, a business server apparatus (3) 105, a business server apparatus (4) 105, a storage device (3) 106, and a storage device (4) 106 are arranged from the top, with the temperature sensor 203 arranged between each apparatus. In a rack 202c, a business server apparatus (5) 105, a business server apparatus (6) 105, a storage device (5) 106, and a storage device (6) 106 are arranged from the top, with the temperature sensor 203 arranged between each apparatus. It is noted that the number of the business server apparatuses 105 and the storage devices 106 mounted on the respective racks and the places where they are arranged are not limited to this layout. And the number of temperature sensors and the places where they are arranged are not limited to this layout.

Figure 4:
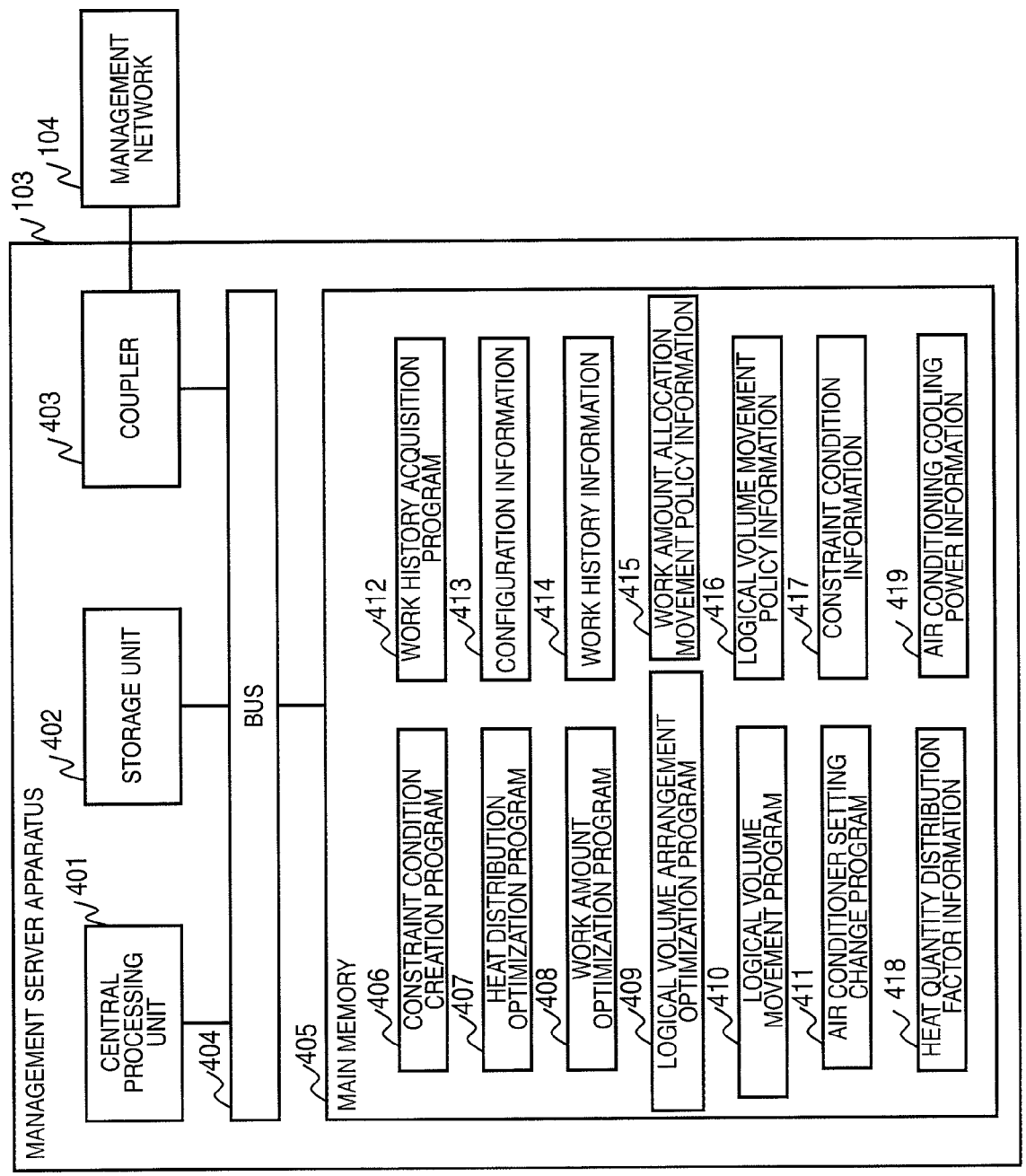
FIG. 4 is a diagram showing the configuration of a management server according to this embodiment.

FIG. 4 is a diagram showing in detail one example of the configuration of the management server apparatus 103 of FIG. 1 according to this embodiment. The management server apparatus 103 comprises a central processing unit 401, a storage unit 402, a coupler 403, a bus 404, and a main memory 405. And the central processing unit 401, the storage unit 402, the coupler 403 and the main memory 405 are coupled via the bus 404. The management server 103 is coupled to the management network 104 via the coupler 403.

And the main memory 405 stores a constraint condition creation program 406, a heat distribution optimization program 407, a work amount distribution optimization program 408, a logical volume arrangement optimization program 409, a logical volume movement program 410, an air conditioner setting change program 411, a work history acquisition program 412, configuration information 413, work history information 414, work amount allocation movement policy information 415, logical volume movement policy information 416, constraint condition information 417, heat quantity distribution factor information 418, and air conditioning cooling power information 419. Each program in the main memory 405 is read and executed by the central processing unit 401.

Also, the storage unit 402 maybe an HDD (Hard Disk Drive) or SSD (Solid State Drive), for example, which stores the functions and information in the main memory 405 that are copied to the main memory 405 when the management server apparatus 103 is started.

The coupler 403 writes information received via the management network 104 into the main memory 405, and sends information read from the main memory 405 via the management network 104.

Figure 5:
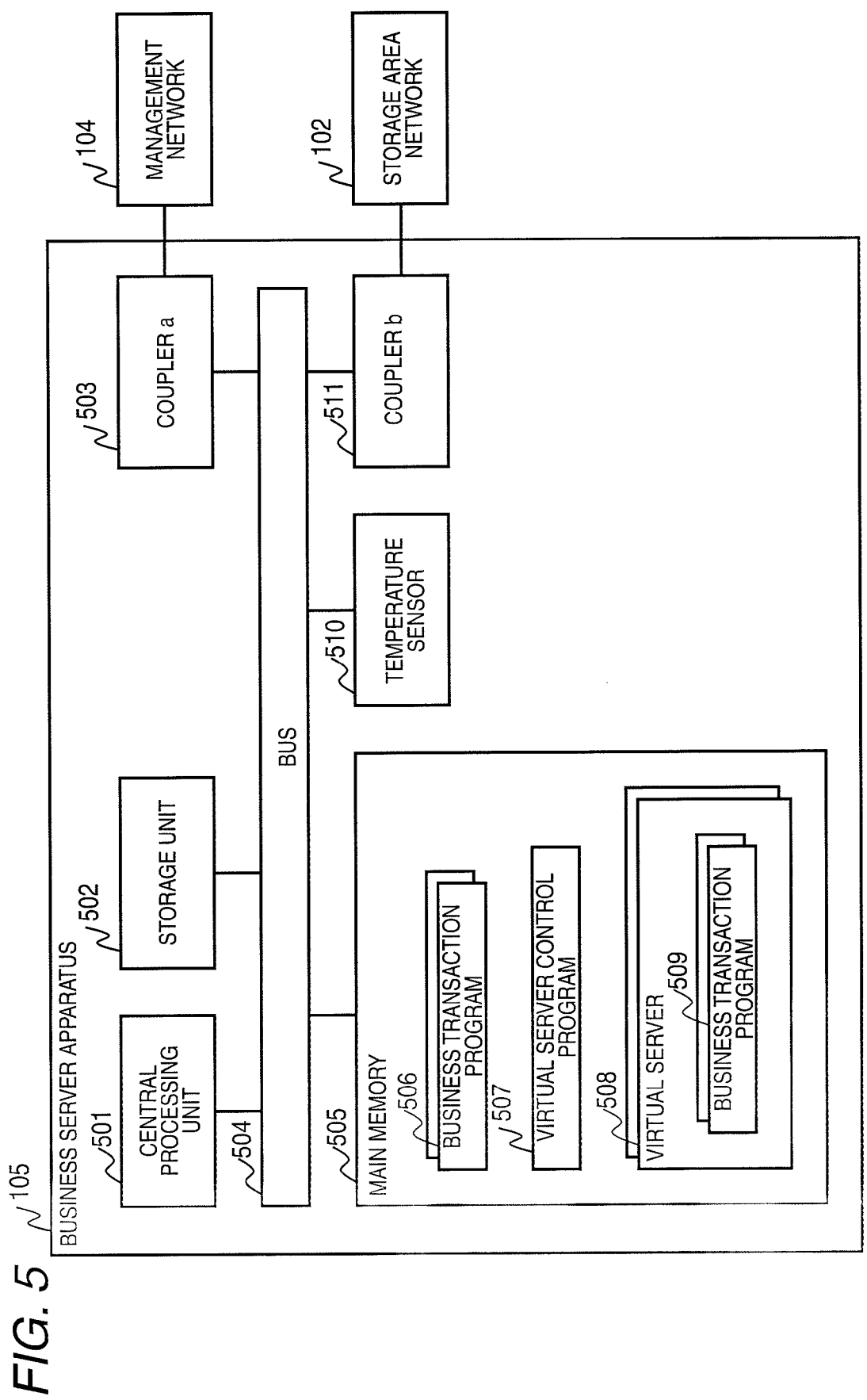
FIG. 5 is a diagram showing the configuration of a business server according to this embodiment.

FIG. 5 is a diagram showing in detail one example of the configuration of the business server apparatus 105 of FIG. 1 in this embodiment. The business server apparatus 105 comprises a central processing unit 501, a storage unit 502, a coupler a 503, a bus 504, a main memory 505, a temperature sensor 510, and a coupler b 511. And the central processing unit 501, the storage unit 502, the coupler a 503, the main memory 505, the temperature sensor 510 and the coupler b 511 are coupled via the bus 504. Further, the business server apparatus 105 is coupled to the management network 104 via the coupler a 503. The business server apparatus 105 is coupled to the storage area network 102 via the coupler b 511.

The main memory 505 stores a business transaction program 506, a virtual server control program 507, and a virtual server 508. The central processing unit 501 executes a program within the main memory 505.

The storage unit 502 may be an HDD or SSD, for example, which stores the program and information in the main memory 505 that are copied to the main memory 505 when the business server apparatus 105 is started.

The coupler a 503 writes information received via the management network 104 into the main memory 505, and sends information read from the main memory 505 via the management network 104.

The coupler b 511 writes information received via the storage area network 102 into the main memory 505, and sends information read from the main memory 505 via the storage area network 102.

The temperature sensor 510 is the sensor for measuring the temperature inside the business server apparatus 105.

The business transaction program 506 is a salary payment computation program, for example, and performs the transaction for a service that the business server 105 provides to the user of the business server 105.

The virtual server control program 507 has a function of controlling the virtual server 508 such as starting, stopping, creating and deleting the virtual server 508.

The virtual server 508 has a function of virtually creating the configuration of the server apparatus to operate the business transaction program 509 within the virtual server 508. The business transaction program 509 has the equivalent function to the business transaction program 506.

If the business transaction program 506 is provided in the main memory 505, the virtual server control program 507, the virtual server 508 and the business transaction program 509 may not be provided. Conversely, if the virtual server control program 507, the virtual server 508 and the business transaction program 509 are provided in the main memory 505, the business transaction program 506 may not be provided.

Figure 6:
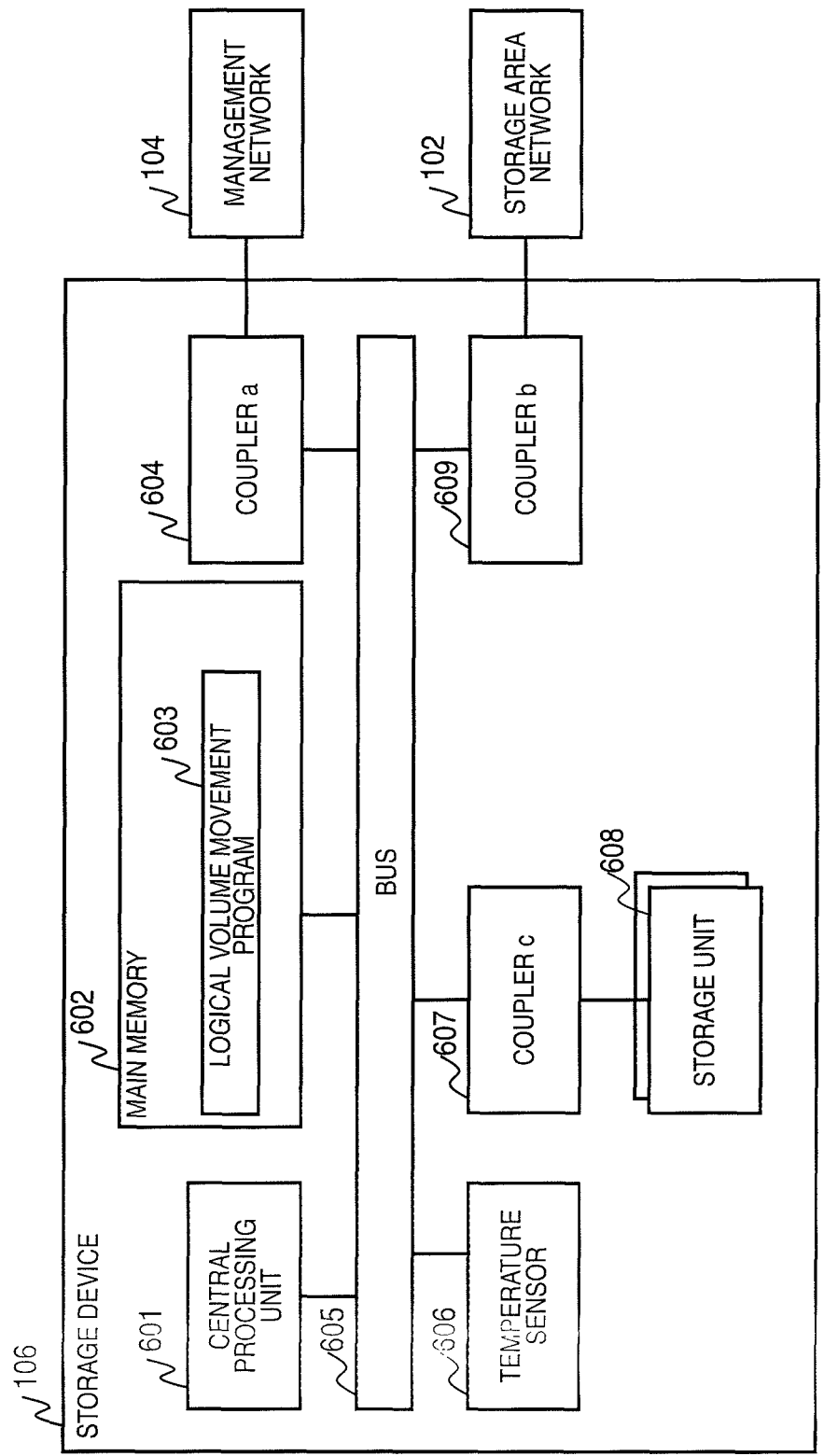
FIG. 6 is a diagram showing the configuration of a storage device according to this embodiment.

FIG. 6 is a diagram showing in detail one example of the configuration of the storage device 106 of FIG. 1 in this embodiment. The storage device 106 comprises a central processing unit 601, a main memory 602, a coupler a 604, a bus 605, a temperature sensor 606, a coupler c 607, a coupler b 609, and a memory unit 608. And the central processing unit 601, the main memory 602, the coupler a 604, the temperature sensor 606, the coupler c 607 and the coupler b 609 are coupled via the bus 605. The storage unit 608 is coupled via the coupler c 607 to the bus 605. Also, the storage device 106 is coupled via the coupler a 604 to the management network 104. The storage device 106 is coupled via the coupler b 609 to the storage area network 102.

The main memory 602 stores a logical volume movement program 603. And the program in the main memory 602 is executed by the central processing unit 601.

The storage unit 608 may be an HDD or SSD, for example, which stores the program and information of the main memory 602 that are copied to the main memory 602 when the storage device 106 is started.

The coupler b receives an instruction from the business server apparatus 105, writes information into the storage unit 601 in accordance with the instruction, or reads information from the storage unit 601, and sends the result to the business server 105.

The logical volume movement program 603 has a function of moving the data stored in the logical volume within the storage unit 601 to another storage device 106. More specifically, it has a function of copying the data of the logical volume within the storage device 106 of movement source to the logical volume created in the RG within the storage device 106 of movement destination. And it has a function of deleting the logical volume within the storage device 106 of movement source.

A table 701 of FIG. 7 includes a part of configuration information 413 of FIG. 4 in this embodiment, and lists the positional information of the air conditioner, the temperature sensor and each rack. The positional information is not limited to this list. The positional information may be indicated for each of the storage device and the business server apparatus included in each rack. More specifically, the table provides information on the arrangement position and size of the air conditioner 101, the temperature sensor 203 and the rack 202 in the data center 201. A device name 702 denotes the name of the air conditioner 101, the temperature sensor 203 or the rack 202. An X coordinate 703, a Y coordinate 704 and a Z coordinate 705 denote the arrangement position of each device in the data center 201. A width 706, a depth 707 and a height 708 denote the dimensions of each device. It is noted that the temperature sensor may not have the size as it is necessary that the position of measuring the temperature is known.

A table 801 of FIG. 8 includes a part of configuration information 413 of FIG. 4 in this embodiment, and lists information indicating the relationship among the storage device 106 or the business server apparatus 105, the rack 202 for mounting each apparatus, and the owner. A device name 802 denotes the name of the storage device 106 or the server apparatus 105. A rack name 803 denotes the name of the rack 202 on which each apparatus is mounted. An owner 804 denotes the owner of each apparatus. A heating value function 805 is a functional expression of computing the heating value when the work amount is x. Each storage device is composed of a storage unit such as a Hard Disk Drive (HDD) having an FC (Fiber Channel) interface, an HDD having SATA (Serial Advanced Technology Attachment) interface, or a storage unit such as Flash Memory (FM). And the heating value for the work amount is varied depending on the type of the HDD having the FC interface, the HDD having SATA interface, or the storage unit such as FM. Each function may be decided depending on the type of the storage unit provided for each storage device, or obtained by making the measurement beforehand for each storage device. In this embodiment, the heating value function is a linear function for simplicity, but is not limited to the linear function. Though in this embodiment, the heating value for the work amount of each storage device is computed using the function, the heating value may be alternatively obtained using a table. In this way, the heating value of each storage device can be calculated more correctly by calculating the heating value for the work amount for each storage device or business server apparatus.

A table 901 of FIG. 9 includes a part of configuration information 413 of FIG. 4 in this embodiment, and lists information on the storage device 106 on which the storage unit 608 is mounted and an RG (RAID (Redundant Arrays of Inexpensive Disks) Group) to which the storage unit 608 belongs. The RAID involves a technique for collectively managing a plurality of storage units as one storage unit. By configuring the RAID, the data can be distributed and written into the plurality of storage units making up the RAID, so that the data read and write speed may be increased. Also, since error correcting information for restoring the data is written into the storage units making up the RAID at the time of writing the data, the data can be restored even if any of the storage units making up the RAID fails. The RG denotes the group of storage units making up the RAID.

A storage unit name 902 is the name of the storage unit 608. A storage device name 903 denotes the name of the storage device 106 on which the storage unit 608 is mounted. An RG name 904 denotes the name of the RG to which the storage unit belongs. A power state 905 denotes the power state of the storage unit. If the power is turned on, the power state is "ON", while if the power is turned off, it is "OFF".

A table 1001 of FIG. 10 includes a part of configuration information 413 of FIG. 4 in this embodiment, and lists information on the RG name in which the logical volume is arranged, the capacity of the logical volume, and the movement possibility of the logical volume. The logical volume is the volume in which the RG is divided to gain access to one RG from a plurality of business server apparatuses 105. Only one business server apparatus 105 may gain access to one logical volume. A logical volume name 1002 is the name of the logical volume. An RG name 1003 denotes the name of the RG in which the logical volume is arranged. A capacity 1004 denotes the capacity of the logical volume. A movement possibility 1005 denotes the possibility of moving the data within the logical volume to another logical volume. In the case of "moveable", the data within the logical volume can be moved to another logical volume, while in the case of "immoveable", the data within the logical volume can not be moved to another logical volume. Also, in the case of "moveable", the data moved from another logical volume can be written into the logical volume. A connection source 1006 denotes the server apparatus that gains access to the logical volume. A backup target 1007 denotes the backup target logical volume for backing up the data within the logical volume. A backup target logical volume is the logical volume for storing the data of the backup source logical volume to restore information of the backup source logical volume. More specifically, the data within the logical volume represented in the logical volume name 1002 is copied to the logical volume represented in the backup target 1007. And if the RG or storage unit making up the logical volume represented in the logical volume name 1002 fails and is replaced, or erroneous data is written into the logical volume represented in the logical volume name 1002, the data is restored by copying it from the logical volume represented in the backup target 1007 to the logical volume represented in the logical volume name 1002.

A table 1101 of FIG. 11 includes a part of configuration information 413 of FIG. 4 in this embodiment, and lists information on the RG. An RG name 1102 denotes the name of the RG. A RAID level 1103 denotes the RAID level of the RG. A disk number 1104 denotes the number of disks making up the RG. A disk type 1105 denotes the type of disks making up the RG. A power consumption 1106 denotes the power consumption of disks making up the RG. A logical volume number 1107 denotes the number of logical volumes arranged in the RG. A free capacity 1108 denotes the free capacity of the RG. A marginal work amount 1109 denotes the marginal work amount of the RG. The marginal work amount of the RG means the marginal work amount capable of maintaining the normal performance of the RG. If an instruction is given to the RG beyond the marginal work amount, the response time to the instruction is longer than not beyond the marginal work amount. The unit of the marginal work amount 1109 is the number of accesses to the RG per second. An upper limit work amount 1110 denotes the upper limit work amount of the RG. The unit of the upper limit work amount 1110 is the number of accesses to the RG per second. If the RG is worked up to reaching the marginal work amount indicated in the marginal work amount 1109, the marginal work amount may be exceeded by an abruptly occurring instruction, whereby the RG is worked with the upper limit work amount represented in the upper limit work amount 1110 as the upper limit. Though in this embodiment, the marginal work amount and the upper limit work amount are set for each RG, they may be set for each storage device.

A table 1201 of FIG. 12 includes a part of work history information 414 of FIG. 4 in this embodiment, and lists information on the work history of the business server apparatus. A device name 1202 denotes the name of the business server apparatus. The business server apparatus may be physical or virtual business server apparatus. A work amount history 1203 denotes the work amount history of the business server apparatus, and is specifically the activity ratio of the central processing unit. The unit of the activity ratio of the central processing unit is percentage (%). The work amount represented in the work amount history 1203 may be the average work amount in a day, or the instantaneous work amount at a certain time, for example.

Figure 13:
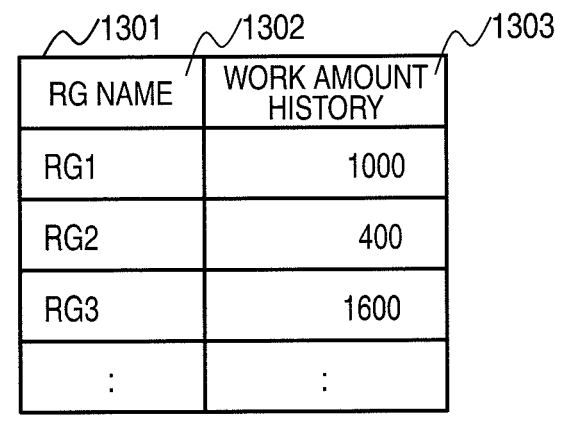

A table 1301 of FIG. 13 includes a part of work history information 414 of FIG. 4 in this embodiment, and lists information on the work history of the RG. An RG name 1302 denotes the name of the RG. A work amount history 1303 denotes the work amount history of the RG. The unit of the work amount history 1303 is the number of accesses to the RG per second. The work amount represented in the work amount history 1303 may be the average work amount in a day, or the instantaneous work amount at a certain time, for example.

Figure 14:
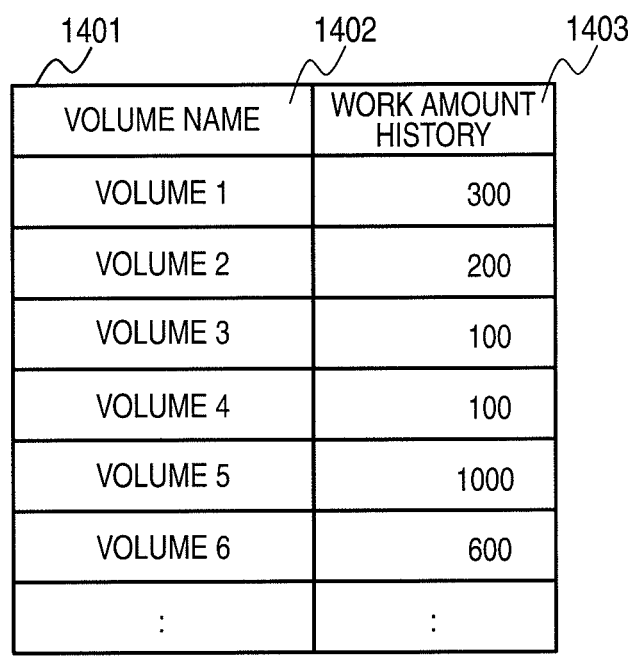
FIG. 14 is a diagram showing the work amount history of the logical volume according to this embodiment.

A table 1401 of FIG. 14 includes a part of work history information 414 of FIG. 4 in this embodiment, and lists information on the work history of the logical volume. A logical volume name 1402 denotes the name of the logical volume. A work amount history 1403 denotes the work amount history of the RG. The unit of the work amount history 1403 is the number of accesses to the logical volume per second. The work amount represented in the work amount history 1403 may be the average work amount in a day, or the instantaneous work amount at a certain time, for example.

A table 1501 of FIG. 15 includes a part of work history information 414 of FIG. 4 in this embodiment, and lists information on the work history of the storage device. A device name 1502 denotes the name of the storage device. A work amount history 1503 denotes the work amount history of the storage device. The unit of the work amount history 1503 is the number of accesses to the storage device per second. The work amount represented in the work amount history 1503 may be the average work amount in a day, or the instantaneous work amount at a certain time, for example.

A table 1601 of FIG. 16 includes a part of configuration information 413 of FIG. 4 in this embodiment, and lists connection information between the storage devices 106. A storage device name 1602 and a storage device name 1603 denote the name of the storage device. It is indicated that two storage devices on the same line are coupled via the storage area network 102, and can communicate with one another.

A table 1701 of FIG. 17 includes a part of configuration information 413 of FIG. 4 in this embodiment, and lists connection information between the server apparatus and the storage device. A server apparatus name 1702 denotes the name of the server apparatus 105. A storage device name 1703 denotes the name of the storage device 106. It is indicated that the server apparatus and the storage device on the same line are coupled via the storage area network 102. That is, the server apparatus can gain access to the storage device.

A table 1801 of FIG. 18 includes the work amount allocation movement policy information 415 of FIG. 4 in this embodiment. A storage device name 1802 denotes the name of the storage device 106. A work amount increase/decrease 1803 denotes an increase or decrease in the work amount of the storage device. The unit of the work amount increase/decrease 1803 is the number of accesses per second. Though the unit of the work amount increase/decrease 1803 is the number of accesses per second, the unit may be alternatively the access time to the logical volume per second, indicating the work amount of the logical volume.

A table 1901 of FIG. 19 includes logical volume data movement policy information 416 in this embodiment. A logical volume name 1902 denotes the name of the logical volume. A movement source RG 1903 denotes the movement source RG of the logical volume. A movement destination RG 1904 denotes the movement destination RG of the data within the logical volume. The policy of moving the data within the logical volume from the movement source RG to the movement destination RG on the same line is represented. Though in this embodiment, the policy of moving the data within the logical volume is created in unit of logical volume, the policy may be created in unit of RG.

Figure 20:
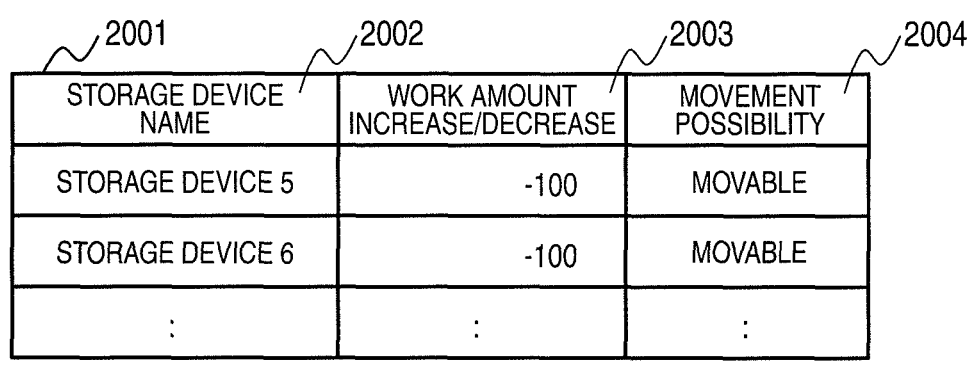
FIG. 20 is a diagram showing the constraint conditions according to this embodiment.

A table 2001 of FIG. 20 includes constraint condition information 417. A storage device name 2002 denotes the name of the storage device 106. A work amount increase/decrease 2003 denotes an increase or decrease in the work amount under the constraint condition. A movement possibility 2004 denotes the possibility of moving the work amount from the storage device.

Figure 21:
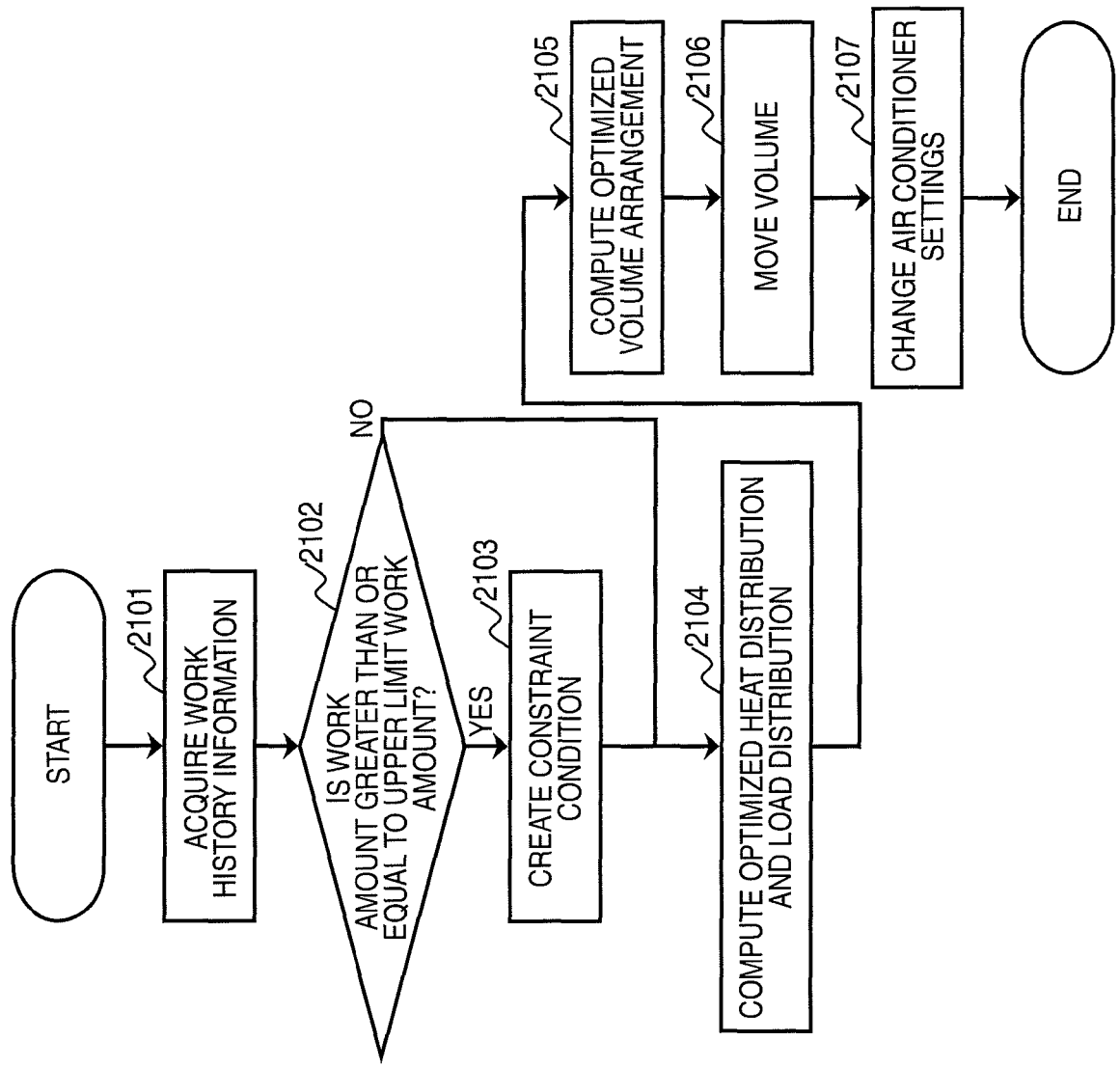
FIG. 21 is a flowchart showing the overall flow of logical volume movement according to this embodiment.

FIG. 21 shows the flow of a process where the management server apparatus 103 decides the data movement destination within the logical volume of the storage device and moves the data within the logical volume to reduce the power consumption over the entire data center 201 in this embodiment.

At step 2101, the central processing unit 401 of the management server apparatus 103 executes the work history acquisition program 412 stored in the main memory to acquire the work history. More specifically, the work amount history is acquired from the storage device 106, and the work amount for each RG is recorded in the work amount history 1303 of the table 1301 (FIG. 13). Also, the work amount for each logical volume is recorded in the work amount history 1403 of the table 1401 (FIG. 14). And the work amount for each storage device is calculated by adding the work amount of the RG belonging to the storage device. The calculation result is recorded in the work amount history 1503 of the table 1501 (FIG. 15). In the case where the RG is spread over the storage devices, the work amount is divided at the ratio of the number of the storage units 608 to the storage units 701, and added to calculate the work amount of the storage device. For example, in the table 901, the RG1 is spread over the storage device 1 and the storage device 2, and the number of storage units is two for each, whereby the value of the work amount of the RG1 divided by two is added to the work amount of each storage device. Since the work amount of the RG1 is 900, the work amount added to each of the storage device 1 and the storage device 2 is 450.

Also, the work amount history is acquired from the business server apparatus 105, and recorded in the work amount history 1203 of the table 1201 (FIG. 12). It is noted that the work amount history maybe acquired for each storage device.

At judgment 2102, it is judged for each RG whether or not the work amount acquired at step 2101 exceeds the upper limit work amount indicated in the upper limit work amount 1110. If there is any RG exceeding the upper limit work amount, the operation advances to step 2103, or if not, goes to step 2104. For example, in the table 1101 (FIG. 11) and the table 1301 (FIG. 13), the upper limit work amount of the RG3 is 1400 but the work amount history is 1600, which is beyond the upper limit work amount, whereby the operation advances to step 2103.

At step 2103, the central processing unit 401 executes the constraint condition creation program 406 to create the constraint condition information 2001. For each RG in which it is judged that the work amount is beyond the upper limit work amount at judgment 2102, the value of subtracting the upper limit work amount indicated in the upper limit work amount 1110 from the work amount of the work amount history 1503 is appended to the work amount increase/decrease 2003. At this time, the movement possibility in the movement possibility 2004 is all movable. For example, since the work amount history of the RG3 exceeds the upper limit work amount by 200 in the table 1101 and the table 1301, the value of decreasing the work amount of each of the storage device 5 and the storage device 6 by 100 is recorded in the table 2001, and the operation goes to step 2104.

Figure 23:
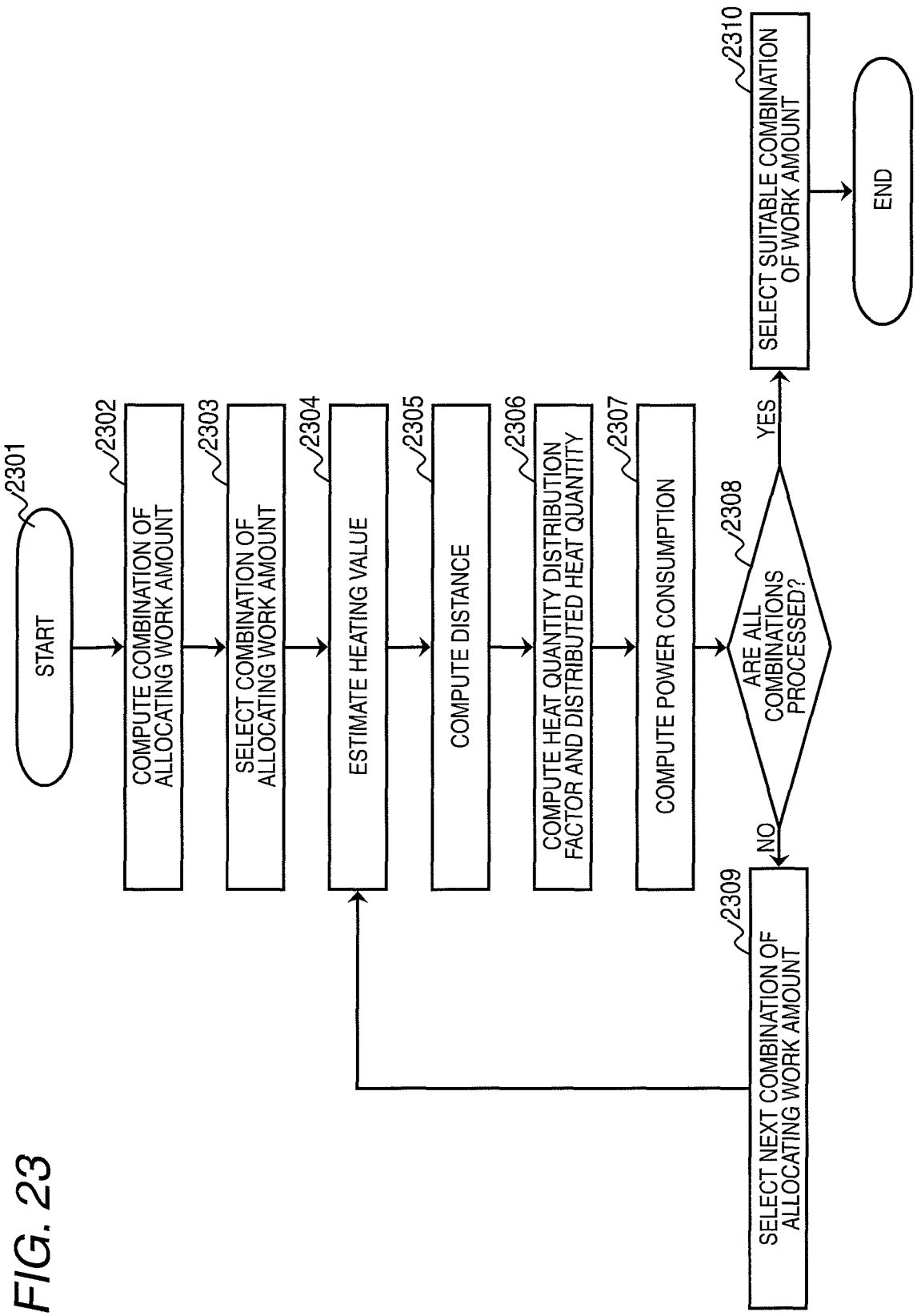
FIG. 23 is a flowchart showing the flow of computing the temperature distribution and the load distribution according to this embodiment.

At step 2104, the optimized (suitable) work amount of allocation is computed. The details of step 2104 are shown in a process from step 2301 to step 2310 in FIG. 23. Step 2104 is performed by the central processing unit 401 executing the work amount optimization program.

At step 2301, the process is started. At step 2302, the combination of allocating the work amount to the plurality of storage devices, and the combination of allocating the work amount to the business server apparatuses are calculated. If there are too many combinations of allocating the work amount to be all calculated in real time, it is preferable to allocate discretely the work amount to each storage device and each business server apparatus. Also, it is preferable to calculate some combinations with an algorithm of a local search method or the like as an approximate method. And the combination not satisfying the constraint condition 2001 is preferably excluded. Under the constraint condition of FIG. 20, any combination for decreasing the work amount of each of the storage device 5 and the storage device 6 by 100 or more is selected.

At step 2303, one combination is selected from among the combinations of allocating the work amount calculated at step 2302.

At step 2304, the heating value occurring from each of the storage device 106 and the business server apparatus 105 is computed (estimated) using the allocation of the work amount selected at step 2302 and the heating value function 805.

At step 2305, the distance 2404 between the storage device 106 or the server apparatus 105 and the air conditioner 101 is computed using the table 701.

At step 2306, the heat quantity distribution factor of distributing the heat generated by the storage device 106 and the server apparatus 105 to the air conditioner 101 inside the data center 201 is computed from the heating value computed at step 2304 and the distance computed at step 2302. Preferably, to obtain the heat quantity distribution factor, a current temperature distribution in the data center is calculated using the temperature sensors 203, 510 and 606, and the heat quantity distribution factor is computed in view of the temperature distribution. More specifically, the percentage of the heat generated by the storage device or server apparatus conducted to the air conditioner is computed, using the function or table of obtaining the different heat distribution depending on the temperature distribution in the data center from the distance 2404.

Thereafter, the quantity of heat conducted from the plurality of storage devices and the plurality of server apparatuses to each air conditioner is calculated from the heating value generated by each of the storage devices and the server apparatuses and the heat quantity distribution factor obtained at step 2305, and the quantity of heat cooled by each air conditioner is calculated.

As one example, the result of obtaining the heat quantity distribution factor of the heating value generated by the storage device and the business server apparatus to the air conditioner is heat quantity distribution factor information 418 as shown in FIG. 24. In FIG. 24, reference numeral 2402 denotes the name of storage device or business server apparatus, reference numeral 2403 denotes the name of air conditioner, reference numeral 2404 denotes the heating value generated from the apparatus of 2402, reference numeral 2404 denotes the heating value generated from the apparatus of 2402, reference numeral 2405 denotes the distance between each apparatus of 2402 and the air conditioner of 2403, and reference numeral 2406 denotes the distribution factor (%) at which the heat generated from each apparatus of 2402 is conducted to each air conditioner. For example, if the function for obtaining the distributed quantity of heat is y=1/x (y: quantity of heat, x: distance), the degree of conducting the heat is ½ because the distance 2405 in the line 2407 is 2 in FIG. 24. Similarly, the degree of conducting the heat is computed in each line from the line 2408 to the line 2412. The total sum of the degree of conducting the heat from the line 2407 to the line 2412 is 3139/2520 (½+⅕+⅛+⅙+⅐+⅑), and the distribution factor 2406 in the line 2407 is ½÷3139/2520=40%. Similarly, the distribution factor 2406 in each line from the line 2408 to the line 2412 is computed. And when the heating value of the storage device 1 is 100 W in FIG. 24, a heat of 40 W generated by the storage device 1 is conducted to the air conditioner 1. In this way, the quantity of heat conducted from each of all the storage devices and server apparatuses to each air conditioner is computed.

At step 2307, the power consumption for each air conditioner to cool the quantity of heat distributed to each air conditioner is computed from the quantity of heat distributed to each air conditioner in the heating value of each of the storage device and the server apparatus computed at step 2306. For example, the total quantity of heat generated by each apparatus and conducted to the air conditioner, which is obtained at step 2306, is calculated. And the power consumption of the air conditioner required for cooling the total quantity of heat is obtained, using a table of FIG. 25 that is one example of air conditioning cooling ability information. In FIG. 25, a heat quantity 2502 is the quantity of heat conducted from the storage device and the server apparatus to the air conditioner. An air conditioning output 2503 is the rank of air conditioning output required for cooling the quantity of heat conducted to the air conditioner. And a power consumption 2504 is electric power consumed by the air conditioner at the time of the air conditioning output 2503.

Thereafter, if the process from step 2304 to step 2307 is not performed for all the combinations of allocating the work amount calculated at step 2302 (judgment 2308: NO), the next combination of allocating the work amount is selected from among the combinations of allocating the work amount not subjected to the process from step 2304 to step 2307 at step 2309.

And the process from step 2304 to step 2307 is performed for the combination of allocating the work amount selected at step 2309.

If the process from step 2304 to step 2307 is performed for all the combinations of allocating the work amount calculated at step 2302 (judgment 2308: YES), the combination of allocating the work amount with the smallest power consumption among the calculated power consumptions is selected at step 2310. And the result of selecting the combination of allocating the work amount is recorded in the table 1801. In this embodiment, since the heating value of the apparatus within the rack a 202a is larger, and the air conditioning efficiency is lower, the heating value of the rack a 202a is decreased. As a result of numerical calculation, the work amount of each of the storage device 1 and the storage device 2 is decreased by 200 to increase the air conditioning efficiency. This result is recorded in the table 1801. Thereafter, step 2104 is ended, and the operation advances to step 2105.

At step 2105, the central processing unit 401 executes the logical volume arrangement optimization program 409 to compute the data stored in which logical volume to move to which RG, based on the combination of allocating the work amount created at step 2104.

Figure 22:
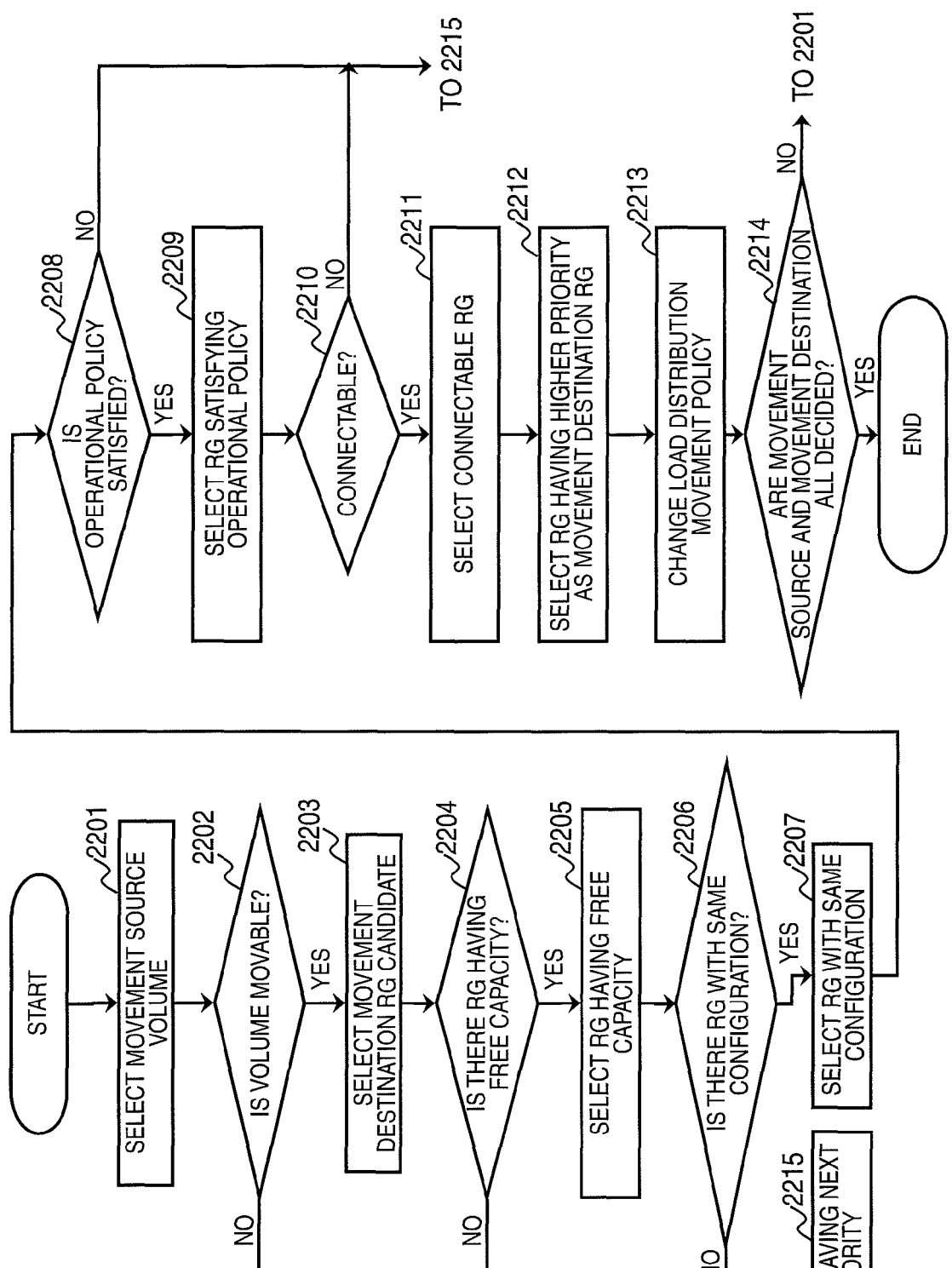
FIG. 22 is a flowchart showing the flow of deciding the movement destination of the logical volume according to this embodiment.

FIG. 22 is a flowchart showing the details of step 2105 in FIG. 21. At step 2201 of FIG. 22, the storage device to decrease the work amount is firstly selected. And the priority is given to the logical volumes included in the storage device, and the logical volume having the highest priority is selected as the logical volume of movement source.

More specifically, the storage device to decrease the work amount (in which the work amount increase/decrease has a negative value) is selected in the work amount increase/decrease 1803 of the table 1801. In FIG. 18, as the storage devices to decrease the work amount, the storage device 1, the storage device 2, the storage device 5 and the storage device 6 are selected in the table 1801. And to keep the performance required for the storage device and reduce the power consumption in the entire storage device after movement, the priority of logical volume movement is decided for the logical volumes included in the storage device in the following order. The following order of deciding the priority is defined independently.

The higher priority is decided in order from the logical volumes within the RG in which it is judged that the upper limit work amount is exceeded at judgment 2102. Thereafter, the higher priority is decided in any order from (1) to (4) as below. That is, the movement destination RG of the logical volume within the RG in which it is judged that the upper limit work amount is exceeded at judgment 2102 is decided ahead, and then the movement destination RG is decided in any order from (1) to (4).

(1) Descending order of the power consumption 1106 of the RG to which the logical volume belongs (2) Ascending order of the number of logical volumes 1107 of the RG to which the logical volume belongs (3) Ascending order of the total sum of the number of logical volumes 1107 of the RG within the storage device to which the logical volume belongs (4) Descending order of the number of storage devices spread over by the RG to which the logical volume belongs The condition (1) is provided to reduce the power consumption of the storage device by moving the data within the logical volume from the RG having high power consumption to the RG having low power consumption. The condition (2) is provided to shut down the power to the storage units making up the RG by moving all the data within the logical volume included in the RG. The condition (3) is provided to shut down the power to the storage device by moving all the data within the logical volume of the storage device. The condition (4) is provided to prevent an increase or decrease in the work amount of the plurality of storage devices by preventing movement of the RG spread over the storage devices.

And the following process is performed with the logical volume having the highest priority as the logical volume of movement source.

At judgment 2202, it is judged whether or not the logical volume of movement source is the movable logical volume. It is judged from the table 1001 whether or not the data within the logical volume of movement source selected at step 2201 is movable. If the selected logical volume of movement source is immovable, the operation goes to step 2215. If the logical volume is movable, the operation advances to step 2203. Herein, at step 2215, the logical volume having the next priority to the logical volume of movement source selected according to the given priority at step 2201 is selected, and the operation returns to judgment 2202.

At step 2203, the movement destination RG candidate to move the data within the logical volume is selected. More specifically, the storage device to increase the work amount (in which the work amount increase/decrease 1803 is a positive value) is selected in the work amount increase/decrease 1803 of the table 1801. That is, the storage device 3 and the storage device 4 are selected as the storage devices to decrease the work amount from the table 1801. And to reduce the power consumption of the entire storage device, the priority as the RG of movement destination is decided for the RG included in the storage device at the time of moving the data within the logical volume in the following order.

(1) Ascending order of the power consumption 1106 of the RG (2) Ascending order of the free capacity 1108 of the RG (3) Descending order of the number of logical volumes 1107 of the RG (4) Ascending order of the total sum of the free capacity 1108 of the RG within the housing (5) Descending order of the total sum of the number of logical volumes 1107 of the RG within the housing (6) Ascending order of the number of housings spread over by the RG Under the condition (1), the power consumption of the storage device can be reduced by moving the data within the logical volume to the RG having lower power consumption. This is because the increased power consumption is smaller by moving the logical volume to the RG having low power consumption than the RG having high power consumption. The conditions (2) and (3) are provided to shut down the power to the storage units making up the RG where the data is not stored by collecting the data into the certain RG. By shutting down the power to the storage units making up the RG, the power consumption can be reduced. The conditions (4) and (5) are provided to shut down the power to the storage device by collecting the data into the certain storage device and moving all the logical volumes within the storage device. By shutting down the power to the storage device, the power consumption can be reduced. The condition (6) is provided to prevent an increase or decrease in the work amount of the plurality of storage devices by movement of the RG spread over the storage devices.

At judgment 2204, it is judged whether or not there is free capacity for storing the data within the logical volume of movement source in the RG of movement destination selected at step 2203, using the table 1101. If there is the RG having free capacity, the operation advances to step 2205. If there is not the RG having free capacity, the operation goes to step 2215. The step 2215 is performed as described above. At step 2205, the RG having free capacity is selected as the new movement destination RG candidate.

At judgment 2206, it is judged whether or not there is the RG with the same configuration. It is checked whether or not the RG with the same configuration as the RG to which the selected logical volume of movement source belongs exists among the movement destination RG candidates selected at step 2205. If there is the RG with the same configuration, the operation advances to step 2207. If there is not the RG with the same configuration, the operation goes to step 2215. When the RAID level 1103, the number of disks 1104 and the disk type 1105 are all the same values in the table 1101, the RG is regarded as having the same configuration. It is noted that the disk type may be different. The step 2215 is performed as described above. At step 2207, the RG with the same configuration as the selected logical volume of movement source is selected as the new movement destination RG candidate among the RGs selected at step 2205.

At judgment 2208, it is checked whether or not the operational policy is satisfied. More specifically, it is checked whether or not the owner of the storage device to which the selected logical volume of movement source belongs and the owner of the storage device to which the RG selected at step 2207 belongs are identical. If there is the RG with the same owner, the operation advances to step 2209. If there is not the RG with the same owner, the operation goes to step 2215. The step 2215 is performed as described above. At step 2209, the RG belonging to the storage device with the same owner as the storage device to which the selected logical volume of movement source belongs is selected as the new movement destination RG candidate among the RGs selected at step 2207.

At judgment 2210, the connectivity is checked. First of all, it is checked whether or not the storage device to which the selected logical volume of movement source belongs can be coupled to the storage device to which the movement destination RG selected at step 2209 belongs. For this purpose, it is checked whether or not the storage device to which the selected logical volume of movement source belongs and the storage device to which the selected movement destination RG belongs can be coupled, using the table 1601. Next, it is checked whether or not they can be coupled to the backup destination. For this purpose, it is checked whether or not the storage device to which the selected movement destination RG belongs and the storage device to which the logical volume of the backup destination 1007 of the selected movement source logical volume belongs are coupled, using the table 1601. Next, it is checked whether or not the storage device of movement destination RG can be coupled to the connection source server to which the logical volume of movement source belongs. For this purpose, the server apparatus coupled to the storage device to which the selected logical volume of movement source belongs is acquired from the connection source 1006, and it is checked whether or not the server apparatus can be coupled to the storage device to which the RG selected at step 2209 belongs, using the table 1701. If the RG satisfying the above three connectivity conditions exists, the operation advances to step 2211. If the RG satisfying the connectivity conditions does not exist, the operation goes to step 2215. The step 2215 is performed as described above. At step 2211, the RG within the storage device satisfying the connectivity conditions is selected as the new movement destination RG candidate among the RGs selected at step 2209.

At step 2212, the RG in which the priority given at step 2203 is higher is selected as the movement destination RG from among the movement destination RG candidates selected at step 2211. And it is stored together with the logical volume of movement source, as shown in FIG. 19. More specifically, the selected logical volume of movement source is recorded in the logical volume name 1902 of the table 1901, records the movement source RG making up the logical volume in the movement source RG 1903, and records the movement destination RG selected at step 2212 in the movement destination RG 1904.

At step 2213, the change policy of allocating the work amount as shown in FIG. 18 is changed. More specifically, the work amount to the logical volume to be moved is added to the item "movement amount increase/decrease" of the storage device to which the logical volume of movement source belongs, and the work amount to the logical volume to be moved is subtracted from the item "movement amount increase/decrease" of the storage device to which the movement destination belongs.

At judgment 2214, if all the RGs that are the movement destination of the data within the logical volume of movement source are decided to create the movement destination RG for the data of the logical volume of movement source, this subroutine is ended, and the operation returns to step 2106. If the creation of the movement policy is not ended, the operation returns to step 2201 to select the new logical volume of movement source.

Through the above process, in the arrangement of satisfying an SLA (Service Level Agreement: agreement between service provider and service recipient regarding the service level) and an operational policy and withstanding the actual operation, the total value of power consumption of the air conditioner and power consumption of the storage device is minimized, and even if the performance is degraded, the increased amount of power consumption is suppressed to the minimum to keep the performance.

At step 2106, the central processing unit 401 executes the logical volume movement program to move the logical volume of movement object. The logical volume movement program 410 instructs the storage device 106 to move the logical volume in accordance with the table 1901. The logical volume movement program 603 moves the logical volume 1 from RG1 to RG2 and moves the logical volume 5 from RG3 to RG2 in accordance with an instruction of logical volume movement. As a result of movement, if there is the RG in which the logical volume number 1107 becomes zero, the power to the storage units making up the RG is shut down to put the power state 905 "off". It is checked from the power state 905 whether or not the power to all the storage units within the storage device where the storage unit with the power shut down is arranged is off, and if the power to all the storage units is off, the power to the storage device is shut down. If the power to the storage device where the storage unit of movement destination is arranged is off in moving the logical volume, the logical volume is moved after the power is turned on. If the power to the storage unit of movement destination is off, the power is turned on, and the power to the storage unit belonging to the RG of movement destination is turned on to put the power state 905 "on", and move the logical volume.

At step 2107, the central processing unit executes the air conditioner setting change program 411 to change the settings of the air conditioner 101 in accordance with the result computed at step 2104.

Though in this embodiment, it is checked whether or not the operational policy is satisfied in deciding the logical volume of movement source and the movement destination RG, the process of FIG. 21 may be performed for each of the business server apparatus and the storage device with the same owner. In this case, the judgment 2208 and the step 2209 are not required.

Though in this embodiment, the unit of the marginal work amount 1109 is the number of accesses to the RG per second, the other units capable of indicating the performance of the RG and estimating the heating value of the RG from the work amount, such as the access time to the RG per second, may be alternatively used.

Also, though the unit of the marginal work amount 1110 is the number of accesses to the RG per second, the other units capable of indicating the performance of the RG and estimating the heating value of the RG from the work amount, such as the access time to the RG per second, may be alternatively used.

Also, though the unit of the work amount history 1303 is the number of accesses to the logical volume per second, the other units capable of indicating the performance of the RG, and estimating the heating value of the logical volume from the work amount, such as the access time to the logical volume per second, may be alternatively used.

Also, though the unit of the work amount history 1403 is the number of accesses to the logical volume per second, the other units capable of indicating the performance of the logical volume and estimating the heating value of the logical volume from the work amount, such as the access time to the logical volume per second, may be alternatively used.

Also, though the unit of the work amount history 1503 is the number of accesses to the storage device per second, the other units capable of indicating the performance of the storage device and estimating the heating value of the storage device from the work amount, such as the access time to the storage device per second, may be alternatively used.

What is claimed is:

1. A control method with a management server apparatus for use in a storage system comprising a plurality of storage devices having a plurality of storage units coupled to said management server apparatus to provide a logical volume and making up a plurality of RAID (Redundant Arrays of Inexpensive Disks) groups, and an air conditioner coupled to said management server apparatus, said method comprising:

calculating plural combinations of allocating the work amount to said plurality of storage devices;

calculating the heating value of each storage device included in said plurality of storage devices for each of said plural combinations;

calculating the distribution factor of said heating value to said air conditioner, based on said heating value and positional information of said plurality of storage devices and said air conditioner for each of said plural combinations;

calculating the quantity of heat conducted to said air conditioner from said heating value and said distribution factor;

calculating the power consumption of said air conditioner to cool said quantity of heat conducted to said air conditioner for each of said plural combinations;

selecting a combination included in said plural combinations based on said power consumption of said air conditioner; and issuing a move instruction of moving the data stored in a first storage device to decrease the work amount to a second storage device to increase the work amount to said plurality of storage devices, based on said selected combination.

2. The control method with the management server apparatus according to claim 1, further comprising acquiring work history information including the work amount of each of said plurality of RAID groups from said plurality of storage devices, calculating plural combinations of allocating the work amount to said plurality of storage devices to decrease the work amount of the storage device to which the RAID group having said work amount beyond an upper limit value belongs among said plurality of storage devices in calculating said plural combinations, calculating said heating value using a heating value function that is a relationship between the work amount and the heating value according to the type of the plurality of storage units included in said plurality of storage devices in calculating said heating value, said plurality of storage devices comprising a temperature sensor, acquiring temperature information measured by said temperature sensor from said plurality of storage devices, calculating the distribution factor of the quantity of heat for said plurality of storage devices to said air conditioner, based on said heating value, the positional information of said plurality of storage devices and said air conditioner, and the temperature information of said plurality of storage devices, in calculating the quantity of heat conducted to said air conditioner from said plurality of storage devices, calculating said power consumption from said quantity of heat conducted to said air conditioner using air conditioning cooling power information in calculating said power consumption, setting a first priority to said logical volume of said first storage device to decide the higher priority in descending order of power consumed by the RAID group including said logical volume, in ascending order of data capacity stored in the RAID group including said logical volume, or in ascending order of the number of said logical volumes stored in the RAID group within said plurality of storage devices, deciding the storage device included in said second storage device that is a movement destination of the data stored in said logical volume in order of said first priority, setting a second priority to the RAID group of said second storage device in ascending order of power consumption of said RAID group, in ascending order of free capacity of said RAID group, or in descending order of the number of logical volumes stored in the RAID group, and deciding said RAID group of said second storage device that is a movement destination to move the data stored in said logical volume of said first storage device in order of said second priority.

3. The control method with the management server apparatus according to claim 1, wherein said plurality of storage devices comprise the temperature sensor, said method further including acquiring the temperature information measured by said temperature sensor from said plurality of storage devices, and calculating the distribution factor of the quantity of heat in said plurality of storage devices to said air conditioner, based on said heating value, the positional information of said plurality of storage devices and said air conditioner, and the temperature information of said plurality of storage devices, in calculating the quantity of heat conducted to said air conditioner from said plurality of storage devices.

4. The control method with the management server apparatus according to claim 1, further comprising calculating said heating value using a relationship between the work amount and the heating value according to the type of the plurality of storage units included in said plurality of storage devices in calculating the heating value for each storage device included in said plurality of storage device for each of said plural combinations.

5. The control method with the management server apparatus according to claim 1, further comprising acquiring the work amount for said RAID group from said plurality of storage devices, and calculating plural combinations of allocating the work amount to said plurality of storage devices to decrease the work amount of the storage device to which the RAID group having said work amount beyond the upper limit value belongs among said plurality of storage devices.

6. The control method with the management server apparatus according to claim 1, further comprising setting the first priority to said logical volume of said first storage device, and deciding the storage device included in said second storage device that is a movement destination of the data stored in said logical volume in order of said first priority.

7. The control method with the management server apparatus according to claim 6, wherein said first priority is decided to be the higher priority in descending order of power consumed by the RAID group including said logical volume, in ascending order of data capacity stored in the RAID group including said logical volume, or in ascending order of the number of said logical volumes stored in the RAID group within said plurality of storage devices.

8. The control method with the management server apparatus according to claim 6, further comprising acquiring the work amount for said RAID group from said plurality of storage devices, calculating plural combinations of allocating the work amount to said plurality of storage devices to decrease the work amount of the storage device to which the RAID group having said work amount beyond the upper limit value belongs among said plurality of storage devices, and setting the priority of the logical volume included in the RAID group having the work amount beyond said upper limit value to be higher than the other logical volumes.

9. The control method with the management server apparatus according to claim 6, further comprising setting a second priority to the RAID group of said second storage device, and deciding said RAID group of said second storage device that is a movement destination to move the data stored in said logical volume of said first storage device in order of said second priority.

10. The control method with the management server apparatus according to claim 9, wherein said second priority is decided to be the higher priority in ascending order of power consumption of said RAID group, in ascending order of free capacity of said RAID group, or in descending order of the number of logical volumes stored in the RAID group.

11. The control method with the management server apparatus according to claim 1, wherein in said storage device, if the number of logical volumes stored in said RAID group becomes zero after moving the data from said first storage device to said second storage device in accordance with said move instruction, the power to the storage units making up said RAID group is shut down.

12. The control method with the management server apparatus according to claim 11, wherein if the power to all the storage units making up said RAID group for the storage device included in said plurality of storage devices is shut down, the power to said storage device is shut down.

13. A storage system comprising a management server apparatus, a plurality of storage devices having a plurality of storage units coupled to said management server apparatus to provide a logical volume and making up a plurality of RAID (Redundant Arrays of Inexpensive Disks) groups, and an air conditioner coupled to said management server apparatus, comprising:
    said management server apparatus calculates plural combinations of allocating the work amount to said plurality of storage devices;
    said management server apparatus calculates the heating value of each storage device included in said plurality of storage devices for each of said plural combinations;

said management server apparatus calculates the distribution factor of said heating value of said plurality of storage devices to said air conditioner, based on said heating value and positional information of said plurality of storage devices and said air conditioner for each of said plural combinations, and calculates the quantity of heat conducted to said air conditioner from said heating value and said distribution factor;

said management server apparatus calculates the power consumption to cool said quantity of heat conducted to said air conditioner for each of said plural combinations;

said management server apparatus selects a combination included in said plural combinations based on said power consumption of said air conditioner; and said management server apparatus issues a move instruction of moving the data stored in a first storage device to decrease the work amount to a second storage device to increase the work amount to said plurality of storage devices based on said selected combination;

wherein said plurality of storage devices move the data from said first storage device to said second storage device in accordance with said move instruction.

14. The storage system according to claim 13, wherein said plurality of storage devices comprise a temperature sensor, said management server apparatus acquires the temperature information measured by said temperature sensor from said plurality of storage devices, and said management server apparatus calculates the distribution factor of the quantity of heat in said plurality of storage devices to said air conditioner, based on said heating value, the positional information of said plurality of storage devices and said air conditioner and the temperature information of said plurality of storage devices, in calculating the quantity of heat conducted to said air conditioner from said plurality of storage devices.

15. The storage system according to claim 13, wherein said management server apparatus calculates said heating value for each storage device included in said plurality of storage devices for each of said plural combinations, using the relationship between the work amount and the heating value according to the type of the plurality of storage units included in said plurality of storage devices in calculating the heating value.

* * * * *